(12) United States Patent
Moriya et al.

(10) Patent No.: US 8,137,473 B2
(45) Date of Patent: *Mar. 20, 2012

(54) METHOD FOR CLEANING ELEMENTS IN VACUUM CHAMBER AND APPARATUS FOR PROCESSING SUBSTRATES

(75) Inventors: Tsuyoshi Moriya, Nirasaki (JP); Hiroshi Nagaike, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1208 days.

This patent is subject to a terminal disclaimer.

(21) Appl. No.: 10/921,947

(22) Filed: Aug. 20, 2004

(65) Prior Publication Data

US 2005/0082000 A1   Apr. 21, 2005

(30) Foreign Application Priority Data

Aug. 25, 2003 (JP) ................................. 2003-300427
Jul. 27, 2004 (JP) ................................. 2004-218939

(51) Int. Cl.
  *B08B 5/00* (2006.01)
  *B08B 7/00* (2006.01)
(52) U.S. Cl. ................................. 134/21; 134/1; 134/37
(58) Field of Classification Search ........................ None
  See application file for complete search history.

(56) References Cited

U.S. PATENT DOCUMENTS

| | | | |
|---|---|---|---|
| 3,420,710 A * | 1/1969 | Wollman | ........................ 134/1 |
| 5,298,720 A | 3/1994 | Cuomo et al. | |
| 5,410,122 A | 4/1995 | Su et al. | |
| 5,522,933 A | 6/1996 | Geller et al. | |
| 5,584,938 A | 12/1996 | Douglas | |
| 5,843,239 A * | 12/1998 | Shrotriya | ...................... 134/1.1 |
| 5,858,108 A | 1/1999 | Hwang | |
| 6,047,713 A | 4/2000 | Robles et al. | |
| 6,323,463 B1 | 11/2001 | Davis et al. | |
| 6,391,118 B2 | 5/2002 | Fujii et al. | |
| 7,004,107 B1 * | 2/2006 | Raoux et al. | .............. 118/723 E |

(Continued)

FOREIGN PATENT DOCUMENTS

JP   3-190227   8/1991

(Continued)

OTHER PUBLICATIONS

Office Action issued Oct. 5, 2010, in Japanese Patent Application No. 2004-218939 with partial English translation.

(Continued)

*Primary Examiner* — Michael Kornakov
*Assistant Examiner* — Nicole Blan
(74) *Attorney, Agent, or Firm* — Oblon, Spivak, McClelland, Maier & Neustadt, L.L.P.

(57) ABSTRACT

To clean an element in a vacuum chamber by causing particles sticking to the element to scatter, the present invention uses a means for applying a voltage to the element and causing the particles to scatter by utilizing Maxwell's stress, a means for electrically charging the particles and causing the particles to scatter by utilizing the Coulomb force, a means for introducing a gas into the vacuum chamber and causing the particles sticking to the element to scatter by causing a gas shock wave to hit the element, a means for heating the element and causing the particles to scatter by utilizing the thermal stress and thermophoretic force, or a means for causing the particles to scatter by applying mechanical vibrations to the element. The thus scattered particles are removed by carrying them in a gas flow in a relatively high pressure atmosphere.

12 Claims, 16 Drawing Sheets

U.S. PATENT DOCUMENTS

2002/0028566 A1* 3/2002 Yano .............................. 438/484
2002/0096195 A1* 7/2002 Harvey et al. ................... 134/21

FOREIGN PATENT DOCUMENTS

| JP | 05-347253 | 12/1993 |
| JP | 8-102456 | 4/1996 |
| JP | 8-167643 | 6/1996 |
| JP | 09-008005 | 1/1997 |
| JP | 09-148310 | 6/1997 |
| JP | 2002-100567 | 4/2002 |

OTHER PUBLICATIONS

Ray Burghard, et al., "In Situ Particle Monitors: The Next Level of Yield Control for Critical Processes", YE-198, pp. 7-10.

Ray Burghard, et al., "In Situ Particle Monitors: The Next Level of Yield Control for Critical Processes", ISSM 2006, pp. 1-10.

Tsuyoshi Moriya, et al., "Particle Reduction and Control in Plasma Etching Equipment", IEEE Transactions on Semiconductor Manufaturing, vol. 18, No. 4, Nov. 2005, pp. 477-486.

* cited by examiner

Fig. 2

| STAGE SURFACE (PERMITTIVITY) | FINE PARTICLES (PERMITTIVITY) | AMOUNT OF PARTICLE SCATTERING |
|---|---|---|
| Si ($\varepsilon=11$) | CF BASED ($\varepsilon=2$) | LARGE |
| Si ($\varepsilon=11$) | SiO$_2$ ($\varepsilon=4$) | SMALL |
| SiO$_2$ ($\varepsilon=4$) | CF BASED ($\varepsilon=2$) | SMALL |
| SiO$_2$ ($\varepsilon=4$) | SiO$_2$ ($\varepsilon=4$) | NONE |
| RESIST ($\varepsilon=3$) | CF BASED ($\varepsilon=2$) | SMALL |
| RESIST ($\varepsilon=3$) | SiO$_2$ ($\varepsilon=4$) | SMALL |
| Al$_2$O$_3$ STAGE ($\varepsilon=9$) | CF BASED ($\varepsilon=2$) | LARGE |
| Al$_2$O$_3$ STAGE ($\varepsilon=9$) | SiO$_2$ ($\varepsilon=4$) | SMALL |
| POLYIMIDE FILM t=75 $\mu$m ($\varepsilon=2$) | CF BASED ($\varepsilon=2$) | SMALL |
| POLYIMIDE FILM t=125 $\mu$m ($\varepsilon=2$) | CF BASED ($\varepsilon=2$) | NONE |

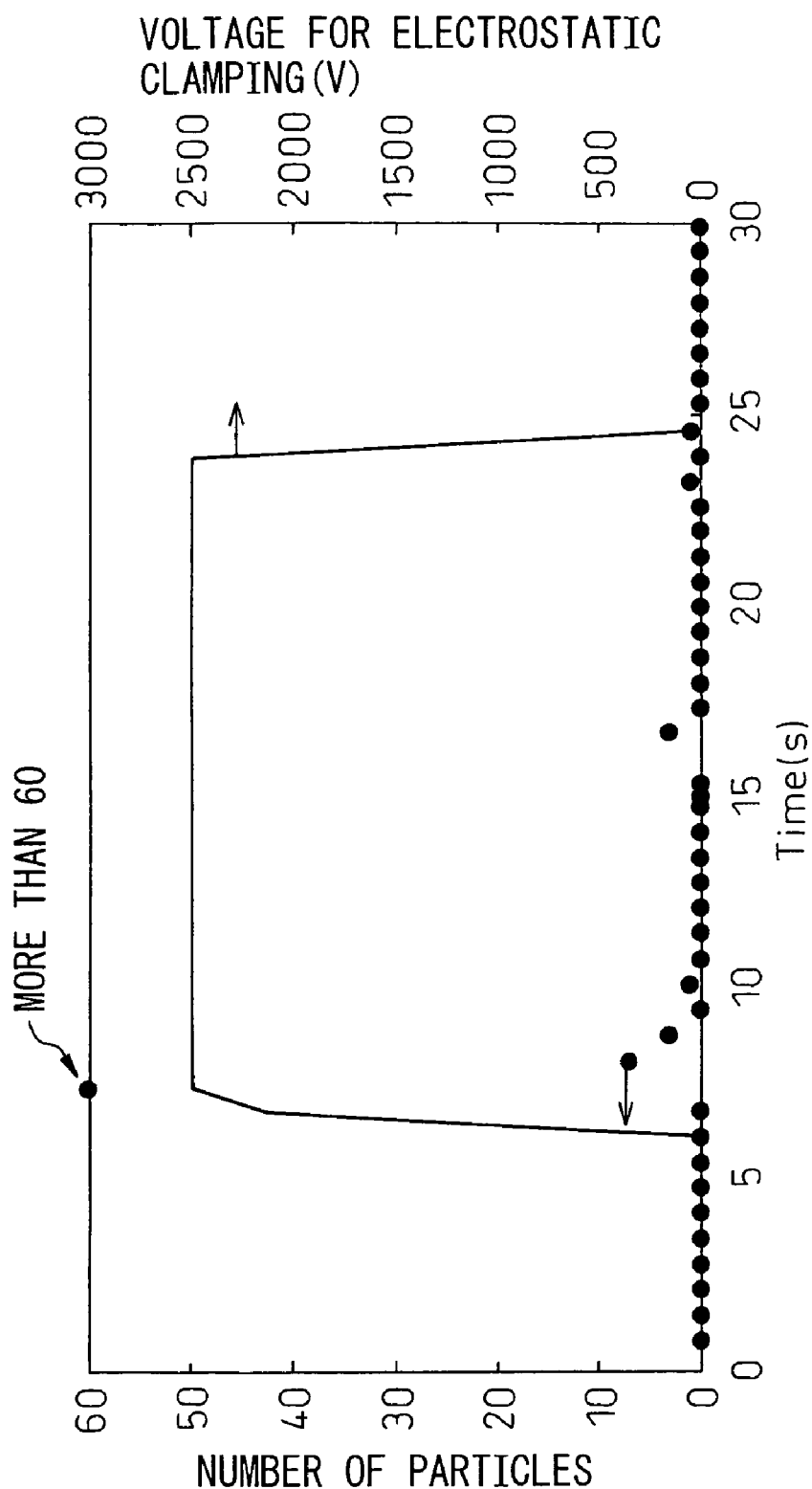

$6.7 \times 10^{-2}$ Pa ($5.0 \times 10^{-4}$ Torr)

$1.3 \times 10^{2}$ Pa ($1.0 \times 10^{-0}$ Torr)

METHOD FOR CLEANING ELEMENTS IN VACUUM CHAMBER AND APPARATUS FOR PROCESSING SUBSTRATES

BACKGROUND OF THE INVENTION

1. Field of the Invention

The present invention relates to a technique for cleaning elements in a vacuum chamber and, more particularly, to a technique for cleaning a stage, or the like, for holding, for example, a substrate to be processed.

2. Description of the Related Art

In the manufacturing processes of semiconductors or flat panel displays (FPDs) such as liquid crystal displays, a major concern is to prevent substrates, during processing, being contaminated with particles entering from outside the manufacturing equipment or generated within the manufacturing equipment. In particular, if the stage installed in a vacuum chamber is contaminated with particles, the particles may stick to the underside of the substrate mounted thereon, and the contamination may spread in subsequent steps, eventually rendering the final products defective.

FIG. 1 shows a schematic diagram of a conventional plasma etching apparatus. A stage 2, for holding a substrate to be processed, is disposed inside a vacuum chamber 1, and a high-frequency power supply unit 3 as a bias power supply unit is connected via a capacitor 4 to the stage 2 to which is also connected, via a low-pass filter 6, to an electrostatic power supply unit 5 for holding the substrate onto the stage 2. The vacuum chamber is grounded, and its upper surface acts as an upper electrode 7. The surface of the stage 2 is coated with alumina, polyimide, or the like, and the semiconductor substrate is attracted onto it when a DC voltage is applied from the electrostatic power supply unit 5. A focus ring 8 is mounted on the peripheral portion of the stage 2 in such a manner as to encircle the substrate placed thereon. The focus ring is a ring-shaped plate made of a material similar to that of the substrate, for example, and is provided to hold a generated plasma on the substrate. A processing gas is introduced through gas inlet ports 10 of a shower head 9 disposed above the stage. Though not shown here, a pump for partially or wholly evacuating the chamber is provided. In the illustrated example, it is assumed that particles P are left sticking to the stage 2.

When performing processing in the above vacuum chamber, the semiconductor substrate (not shown) is placed on the stage 2, and is held on it by electrostatic attraction by applying a voltage from the electrostatic power supply unit 5; then, a reactive gas for processing is introduced into the chamber 1 through the gas inlet ports 10 of the shower head 9, and a plasma is generated by supplying power from the high-frequency power supply unit 3, to perform a predetermined processing. At this time, if the particles P are left sticking to the stage 2, they stick to the underside of the substrate during processing, and the contamination spreads in subsequent steps, leading to such problems as a reduced production yield of the finally produced semiconductor devices.

Possible sources of such particles include, for example, those entering from outside the chamber, those due to the contact friction between the stage 2 and the semiconductor substrate, and those formed by the deposition of products of the reactive gas. In view of this, Japanese Unexamined Patent Publication No. 2002-100567, for example, proposes a method of keeping the stage clean by cleaning it with a brush scrubber or a wiper blade or by spraying a clean liquid or gas onto the stage.

However, since such cleaning means usually requires opening the lid of the chamber and thus exposing the chamber to the atmosphere, the cleaning itself can cause contamination. Further, using a brush scrubber or a wiper blade under reduced pressure is not effective in removing particles (for examples, particles with particle size of about 10 nm); on the contrary, this runs the risk of generating new particles due to physical friction. On the other hand, cleaning the stage with a liquid requires a complicated structure for cleaning, and greatly reduces throughput. Moreover, by simply spraying a gas, it is difficult to thoroughly clean the stage, because the collision cross section between the particle and the gas is very small.

SUMMARY OF THE INVENTION

In view of the above problems, it is an object of the present invention to provide an element cleaning method that removes particles from the surface of an element in a vacuum chamber by effectively causing the particles to scatter, a substrate processing apparatus that is equipped with means for implementing the cleaning method, a scattering particle detecting apparatus that monitors the cleaning, a method for evaluating cleanness, and a method for detecting the end point of the cleaning.

To solve the above problems, in a first aspect of the invention, particles sticking to the element are caused to scatter in accordance with a permittivity difference between the element and the particles by applying a voltage to the element.

In a second aspect of the invention, particles sticking to the element are electrically charged, and a voltage of the same polarity as the charge of the charged particles is applied to the element, thereby causing the particles sticking to the element to scatter.

In a third aspect of the invention, a gas is introduced while maintaining the vacuum chamber at a predetermined pressure, and particles sticking to the element are caused to scatter by causing a gas shock wave to hit the element.

In a fourth aspect of the invention, particles sticking to the element are caused to scatter by utilizing thermal stress and a thermophoretic force induced by controlling the temperature of the element.

In a fifth aspect of the invention, particles sticking to the element are caused to scatter by applying mechanical vibration to the element.

In a sixth aspect of the invention, while maintaining the vacuum chamber at a pressure equal to or higher than $1.3 \times 10^3$ Pa (10 Torr), particles are caused to scatter and the particles are removed by utilizing a gas flow.

In a seventh aspect of the invention, in a preprocessing step preceding the step of removing the particles by utilizing a gas flow while maintaining the vacuum chamber at a pressure equal to or higher than $1.3 \times 10^3$ Pa (10 Torr), the particles are caused to scatter by holding the vacuum chamber at a pressure lower than $1.3 \times 10^2$ Pa (1 Torr).

In an eighth aspect of the invention, when causing the particles to scatter by utilizing a gas flow while maintaining the vacuum chamber at a pressure equal to or higher than $1.3 \times 10^3$ Pa (10 Torr), mechanical vibration is applied to the particles to be scattered.

In a ninth aspect of the invention, with the element heated and maintained at a high temperature, the step of introducing a gas while maintaining the vacuum chamber at a predetermined pressure and of causing a gas shock wave to hit the element and the step of applying a high voltage to the element are performed simultaneously or successively.

In a 10th aspect of the invention, there is provided a substrate processing apparatus which applies a voltage from an electrostatic power supply unit to the stage on which the substrate to be processed is yet to be mounted, and thereby causes particles sticking to the stage to scatter.

In an 11th aspect of the invention, there is provided a substrate processing apparatus which, while maintaining the vacuum chamber at a predetermined pressure, introduces a gas through a gas inlet pipe toward the stage on which the substrate to be processed is yet to be mounted, and causes particles sticking to the stage to scatter by causing a shock wave, generated by the introduction of the gas, to hit the stage.

In a 12th aspect of the invention, there is provided a substrate processing apparatus which passes a head cooling gas through a gas inlet pipe provided to introduce a gas to an upper surface of the stage and, in this condition, heats the stage with no substrate to be processed mounted thereon up to a predetermined temperature by using a heating means and thereby causes particles sticking to the stage to scatter.

In a 13th aspect of the invention, there is provided a scattering particle detecting apparatus which comprises: a light source for projecting incident light into the vacuum chamber in such a manner that the incident light passes through a space above the element; and a light detector, disposed at a predetermined angle to the incident light, for detecting scattered light occurring due to the particles.

In 14th and 15th aspects of the invention, there are provided a cleanness evaluating method for evaluating the cleanness of an element in a vacuum chamber by detecting scattered light occurring due to particles, and a cleaning end point detecting method for detecting the end point of the cleaning of the element.

BRIEF DESCRIPTION OF THE DRAWINGS

The above object and features of the present invention will be more apparent from the following description of the preferred embodiments with reference to the accompanying drawings, wherein:

FIG. 2 is a diagram showing the results of an experiment in which particles were caused to scatter by utilizing Maxell's stress in accordance with a first embodiment of the present invention;

FIG. 3 is a diagram showing the results of an experiment in which particles were caused to scatter by applying a voltage with a rectangular waveform in accordance with the first embodiment of the present invention;

DESCRIPTION OF THE PREFERRED EMBODIMENTS

Figure 1:
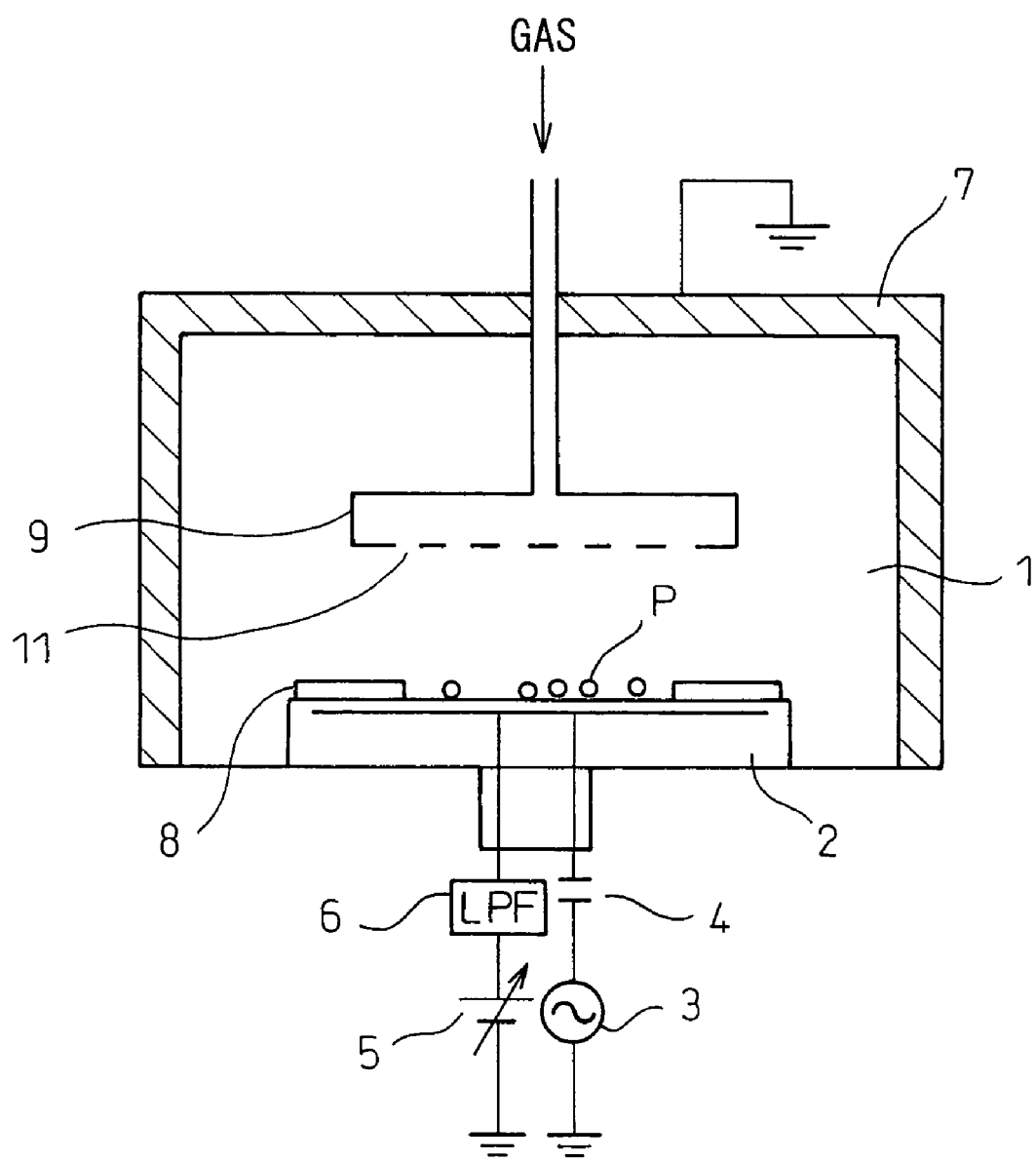
FIG. 1 is a diagram showing a prior art plasma processing apparatus to which the present invention can be applied.

Before proceeding to the description of the preferred embodiments of the invention, the principles of the present invention will be described first. The present inventor et al. analyzed attraction forces acting between particles and the stage, conducted studies on means for separating and scattering particles off the stage by overcoming the attraction forces, and discovered that it would be effective to utilize (1) Maxwell's stress, (2) force generated by gas shock wave, or (3) thermal stress and a thermophoretic force, or a combination of them. That is, experimental results were obtained showing that when these forces were applied to the stage or the particles, the particles were effectively separated and scattered from the stage. Here, a laser light scattering method was used to confirm the scattering of particles.

(1) Utilizing Maxwell's Stress

The present inventor et al. obtained unique experimental results showing that the application of a voltage to an electrostatic stage causes particles sticking to the stage to scatter, and discovered that this phenomenon is attributable to Maxwell's stress.

Maxwell's stress is given by $$F = \rho E - \frac{1}{2}E^2 \nabla \varepsilon + \frac{1}{2}\nabla\left(E^2 \tau \frac{\partial \varepsilon}{\partial \tau}\right) \quad \text{[MATHEMATICAL 1]}$$

where ρ is the amount of charge, E is the electric field, ∈ is the permittivity, and τ is the density.

The first term in the above equation expresses the Coulomb force due to charged particles. The second term indicates that a negative force occurs when an electric field acts at a place where the permittivity changes, since ∇∈ is the differentiation of the permittivity with respect to the place. The third term expresses the force, due to deformation or the like, acting on a substance whose permittivity ∈ varies with the density τ; rubber is an example of such a substance, but when we consider particles existing within semiconductor manufacturing equipment, the third term may be ignored. Accordingly, the forces expressed by the first and second terms can be utilized.

(2) Utilizing the Force Generated by Gas Shock Wave

As a result of an experiment conducted by spraying a gas to the stage, it was discovered that particles cannot be effectively scattered by simply spraying the gas, but can be effectively scattered under certain conditions. That is, in the experiment, the particles could be effectively scattered when a large amount of gas was introduced, at once, into an atmosphere held, for example, at a pressure not higher than $1.3 \times 10^{-2}$ Pa ($1 \times 10^{-4}$ Torr), and, as a result of an analysis, it has been found that when a large amount of gas is introduced at once with a large pressure difference, a shock wave occurs because of the pressure difference and, when it hits the surface of the stage, the particles are effectively scattered. Accordingly, the force generated by a gas shock wave can also be utilized effectively as a means for scattering and removing the particles sticking to the stage.

(3) Utilizing Thermal Stress and Thermophoretic Force

By making the temperature of the stage sufficiently higher or lower than its normal operating temperature by using a stage temperature control means, separation of particles due to thermal stress can be induced. Further, according to an experiment, when the stage was maintained at a high temperature while holding a predetermined pressure, particles were successfully caused to scatter from the stage by the resulting thermophoretic force. In this way, the thermal stress or the thermophoretic force can be utilized for cleaning the stage. Further, in these experiments, in situ particle measurements were performed using a laser light scattering method. It has been found that this apparatus can also be used for monitoring the cleanness of the stage, etc.

The preferred embodiments of the present invention will be described below with reference to the accompanying drawings. The description given herein deals with the case of a plasma etching apparatus as an example, but the present invention is not limited to this particular example, but can be applied to any apparatus, such as a film deposition apparatus, that has a stage on which a substrate is mounted for processing. Further, the stage is not limited to a stage for mounting a semiconductor substrate thereon, but may be a stage intended for any other kind of substrate such as a substrate for a liquid crystal display device. Furthermore, the stage to be cleaned is only one example, and it will be appreciated that the present invention can be applied for cleaning any kind of element in a vacuum chamber.

Embodiment 1

In this embodiment, in case where there is a large difference between the permittivity of the stage surface and the permittivity of the particles, a predetermined electric field is formed on the surface of the stage in accordance with the second term of Maxwell's stress equation, and the particles are caused to scatter by the resulting repelling force.

More specifically, before the substrate to be processed is placed on the stage, a positive or negative voltage is applied to the stage by an electrostatic power supply unit such as shown in FIG. 1. An electric field appears at the surface via a dielectric on the surface of the stage. The strength of the electric field at the surface of the stage is considered to depend on the permittivity and thickness of the dielectric on the surface of the stage but, according to an experiment, a voltage approximately equal to the applied voltage appeared, and the strength of the electric field did not suffer attenuation due to the presence of the dielectric. According to Maxwell's stress equation, if an electric field is applied when there is a difference between the permittivity of the stage surface and the permittivity of the particles, the particles should experience forces that cause the particles to scatter in the directions of the electric lines of force.

FIG. 2 is a table showing the results of the experiment. In the experiment shown in FIG. 2, a number of materials were selected for the stage, and the amount of scattering was detected for two kinds of particles, one made of $SiO_2$ and the other of CF-based polymer. Particle scattering was particularly large in the case where the stage was made of bare silicon (permittivity ∈=11) and the particles deposited thereon were fluorocarbon (CF) based polymer particles (permittivity ∈=2), and also in the case where the stage was made of alumina (permittivity ∈=9) and the particles deposited thereon were fluorocarbon (CF) based polymer particles. In either case, the difference in permittivity is as large as 9 or 7. In the other cases where the difference in permittivity is zero or very small, particle scattering is nearly zero or small.

FIG. 3 shows the results obtained when a rectangular waveform of +2500 V was applied by the electrostatic power supply unit to the bare silicon stage on which CF-based polymer particles had been deposited. The solid line shows the waveform of the electrostatic voltage, and each filled circle indicates the number of particles. As can be seen, many (more than 60) particles were scattered the instant that the voltage was applied.

Figure 4:
FIG. 4 is a picture showing an image of laser scattered light due to scattering particles in accordance with the first embodiment of the present invention.
Figure 5:
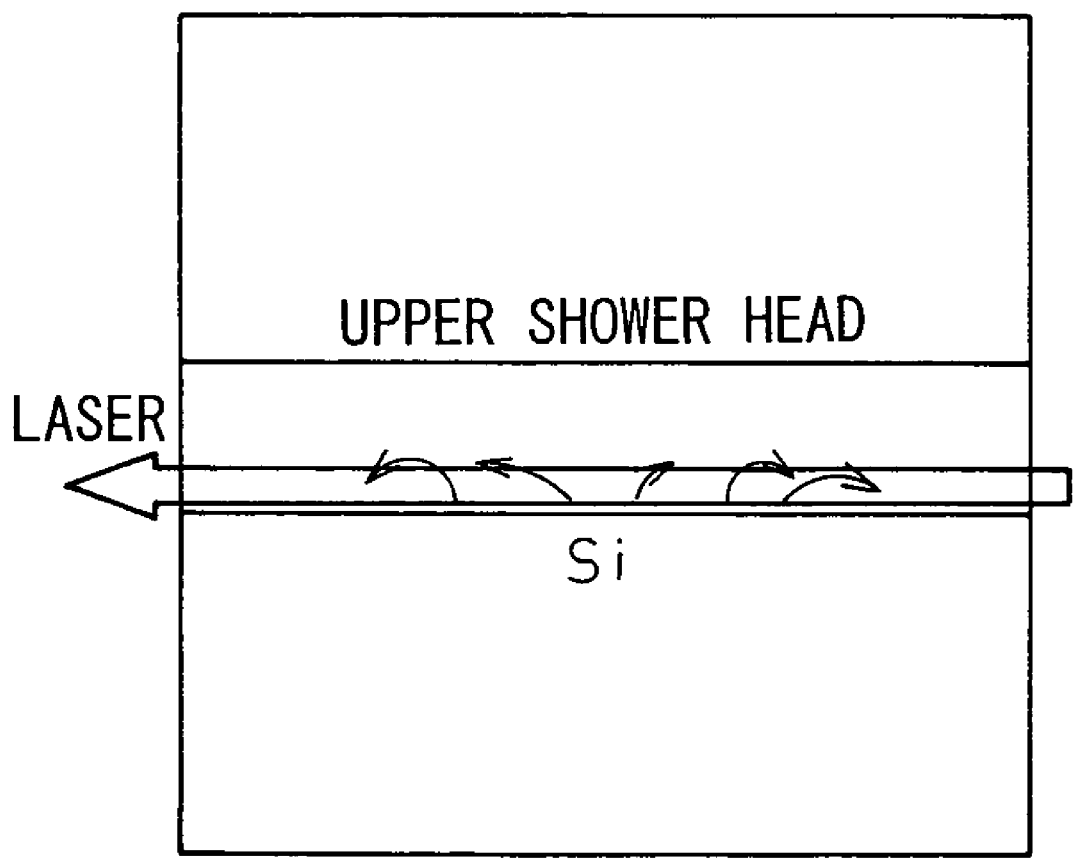
FIG. 5 is an explanatory diagram showing the relationship between laser light and scattering particles in accordance with the first embodiment of the present invention.

As shown in FIGS. 4 and 5, the scattered particles can be detected by using laser light scattering. FIG. 4 shows a photograph taken of the scattered particles when +2500 V was applied to the bare silicon on which CF-based polymer particles had been deposited. As can be seen, many particles are scattering from the surface of the stage. The photograph was taken by projecting laser light in the form of a flat plate-like beam at a height about 3 mm to 4 mm above the stage and by capturing the image from one side thereof using a CCD camera.

Figure 6:
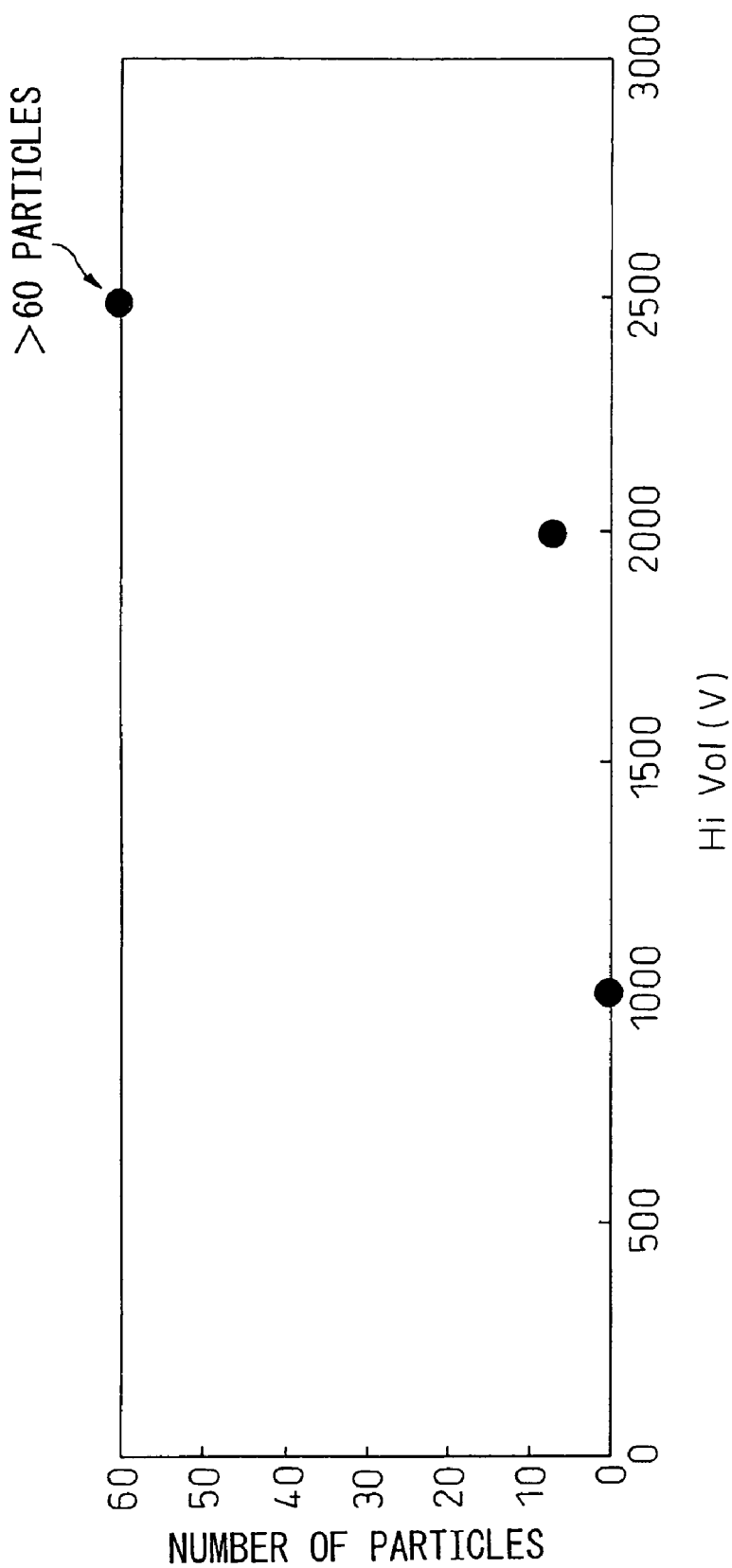
FIG. 6 is a diagram showing the number of scattered particles as a function of an applied voltage in accordance with the first embodiment of the present invention.

FIG. 6 is a graph showing the number of scattered particles as a function of the voltage applied to the stage. The horizontal axis represents the applied high voltage, and the vertical axis represents the number of scattered particles. At 1000 V, no scattered particles were observed, but at 2000 V, about 10 particles were caused to scatter, while at 2500 V, more than 60 particles were caused to scatter. The voltage to be applied for scattering the particles depends on the permittivity and thickness of the dielectric on the surface of the stage and the permittivity and size of the particles; here, it was also found that when fluorocarbon-based particles were left sticking to the electrostatic stage having an alumina ceramic surface as used in a plasma etching apparatus, the particles were successfully scattered and removed by applying a voltage greater than about ±1500 V.

Further, at this time, to effectively remove the scattered particles, a gas such as a nitrogen gas may be passed into the chamber and be drawn off by a pump so that the scattered particles are drawn out the chamber by being carried in the flow of the gas. The method of drawing out the scattered particles by passing a gas can be employed in any of the embodiments hereinafter described.

In the present embodiment, an electrostatic electrode was used to apply the voltage, but a dedicated power supply unit may be provided. Further, the polarity of the applied voltage may be either positive or negative, as described above. In this way, by applying this method prior to the processing of the substrate when the substrate is not yet placed on the stage, particles can be prevented from sticking to the underside of the substrate during processing.

Embodiment 2

When utilizing the difference between the permittivity of the stage surface and the permittivity of the particles as described in the first embodiment above, the effect can be further enhanced by coating the stage surface with a material having permittivity sufficiently larger than that of the particles expected to stick to the surface. Generally, in an environment where the stage surface is likely to be contaminated by the stick of silicon particles, a greater effect can be obtained if the stage surface is coated with a material having permittivity sufficiently larger than 11.

Examples of such materials include $Bi_2O_3$ (permittivity 18.2), CuO (permittivity 18.1), FeO (permittivity 14.2), $KH_2PO_4$ (permittivity 46), $KIO_3$ (permittivity 16.85), $PbBr_2$ (permittivity >30), $PbCl_2$ (permittivity 33.5), $PbCO_3$ (permittivity 18.6), $PbI_2$ (permittivity 20.8), $Pb(NO_3)_2$ (permittivity 16.8), PbO (permittivity 25.9), $PbSO_4$ (permittivity 14.3), $SrSO_4$ (permittivity 18.5), $TiO_2$ (permittivity 85.6 to 170), TlBr (permittivity 30.3), TlCl (permittivity 31.9), TlI (permittivity 21.8), $TlNO_3$ (permittivity 16.5), cyclohexanol (permittivity 16.0), and succinonitrile (permittivity 65.9).

Embodiment 3

In the first embodiment, the forces acting on the particles are exerted throughout the application of the voltage but, as previously shown in FIG. 3, the number of scattered particles greatly increases when the voltage changes (in particular, the instant that the voltage is applied). To utilize this phenomenon, a voltage of rectangular waveform may be applied repetitively to the stage. By so doing, the particles can be efficiently caused to scatter as the voltage is applied and stopped. Since it is the change in voltage that serves to promote the scattering of the particles, the waveform need not be limited to the rectangular waveform, but any other waveform, such as a pulse waveform or a sine waveform, may be used.

The reason is believed to be that particles easier to scatter are scattered at the first application of the voltage and the particles remaining to be scattered are given another change to scatter when the applied voltage is temporarily removed and the voltage is applied once again. A similar effect can also be obtained by applying an AC voltage using an AC power supply. The higher the AC frequency, the greater the effect.

Embodiment 4

This embodiment concerns an example in which particles are caused to scatter by utilizing the Coulomb force. When the permittivity of the stage and the permittivity of the particles are approximately the same (close to each other), the force defined by the second term of Maxwell's stress cannot be utilized, and therefore, the Coulomb force expressed by the first term is utilized. That is, the particles on the stage are deliberately charged, and a voltage of the same polarity as the charge of the charged particles is applied, thus causing the particles to scatter by the electrostatic repulsion. Here, to charge the particles on the stage, a plasma is generated in a space above the stage on which the substrate is not yet to be placed. Charged particles of the generated plasma reach the stage, thus charging the particles on the stage. A suitable gas, such as argon, helium, oxygen, nitrogen, etc., can be used as the gas for generating the plasma, but the gas must not contain any substance that can essentially corrode the material of the stage, and control parameters (power, pressure, flow rate, etc.) must be selected so that the surface of the stage will not be etched by physical sputtering.

As the stage is negatively charged by a self-bias voltage, the particles on the stage are also negatively charged. Accordingly, by applying a negative voltage to the stage, the particles can be scattered off the substrate.

Embodiment 5

In the fourth embodiment described above, the particles sticking to the stage are negatively charged by using a plasma, but the method of charging the particles is not limited to this particular example. Rather, any other suitable method may be employed, for example, a method that positively charges the particles by emitting photoelectrons by applying ultraviolet light or vacuum ultraviolet light, a method that positively or negatively charges the particles by applying ions, or a method that positively charges the particles by emitting photoelectrons by applying an X ray or a soft X ray. By charging the particles using such a method, and applying a voltage of the same polarity as the charge of the charged particles to the stage, the particles can be effectively caused to scatter.

Embodiment 6

According to an experiment conducted by the present inventor et al., when a large amount of gas was introduced in a short time into a vacuum chamber held at a pressure not higher than about $1.3 \times 10^{-2}$ Pa ($1 \times 10^{-4}$ Torr), a shock wave with a maximum speed reaching the speed of sound was generated by the pressure difference, and particles were efficiently scattered by causing the shock wave to hit the stage. Here, during the introduction of the gas, the gas was constantly drawn off by a vacuum pump.

Figure 7:
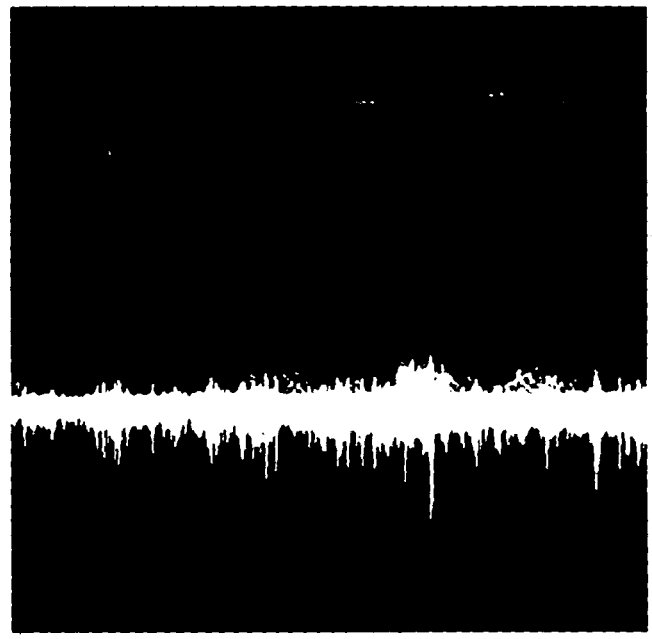
FIG. 7 is a picture showing the scattering of particles caused by a gas shock wave, at a certain pressure, in accordance with a sixth embodiment of the present invention.
Figure 8:
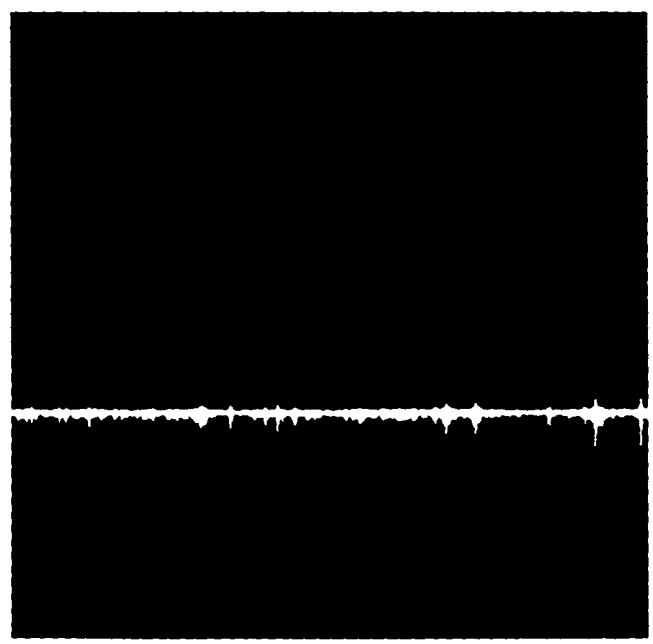
FIG. 8 is a picture showing the scattering of particles caused by a gas shock wave at another pressure in accordance with the sixth embodiment of the present invention.

For example, an $N_2$ gas was introduced at a pressure approximately equal to atmospheric pressure into the vacuum chamber in which bare silicon with $SiO_2$ particles sticking thereto was placed. The $N_2$ gas was introduced using the shower head disposed above the stage. FIGS. 7 and 8 are diagrams each showing, by way of example, the result obtained when the $N_2$ gas was introduced while increasing the pressure of the stage vacuum chamber by utilizing chamber leakage.

FIG. 7 shows the scattering of particles when the pressure of the vacuum chamber was $6.7 \times 10^{-2}$ Pa ($5.0 \times 10^{-4}$ Torr). FIG. 8 shows the scattering of particles when the pressure was $1.3 \times 10^2$ Pa ($1.0 \times 10^{-0}$ Torr). Each diagram shows an image of laser light scattering, captured for three seconds starting from the introduction of the $N_2$ gas.

It is shown that, to scatter many particles, the pressure must be held at about $1.3 \times 10^{-2}$ Pa ($1 \times 10^{-4}$ Torr) or lower, and that, at $1.3 \times 10^2$ Pa ($1.0 \times 10^{-0}$ Torr), hardly any effect is obtained that causes the particles to scatter. Further, according to the experiment, it was found that the scattering of particles occurred immediately following the introduction of the gas, causing 60 to 70% of the particles to scatter.

Figure 9:
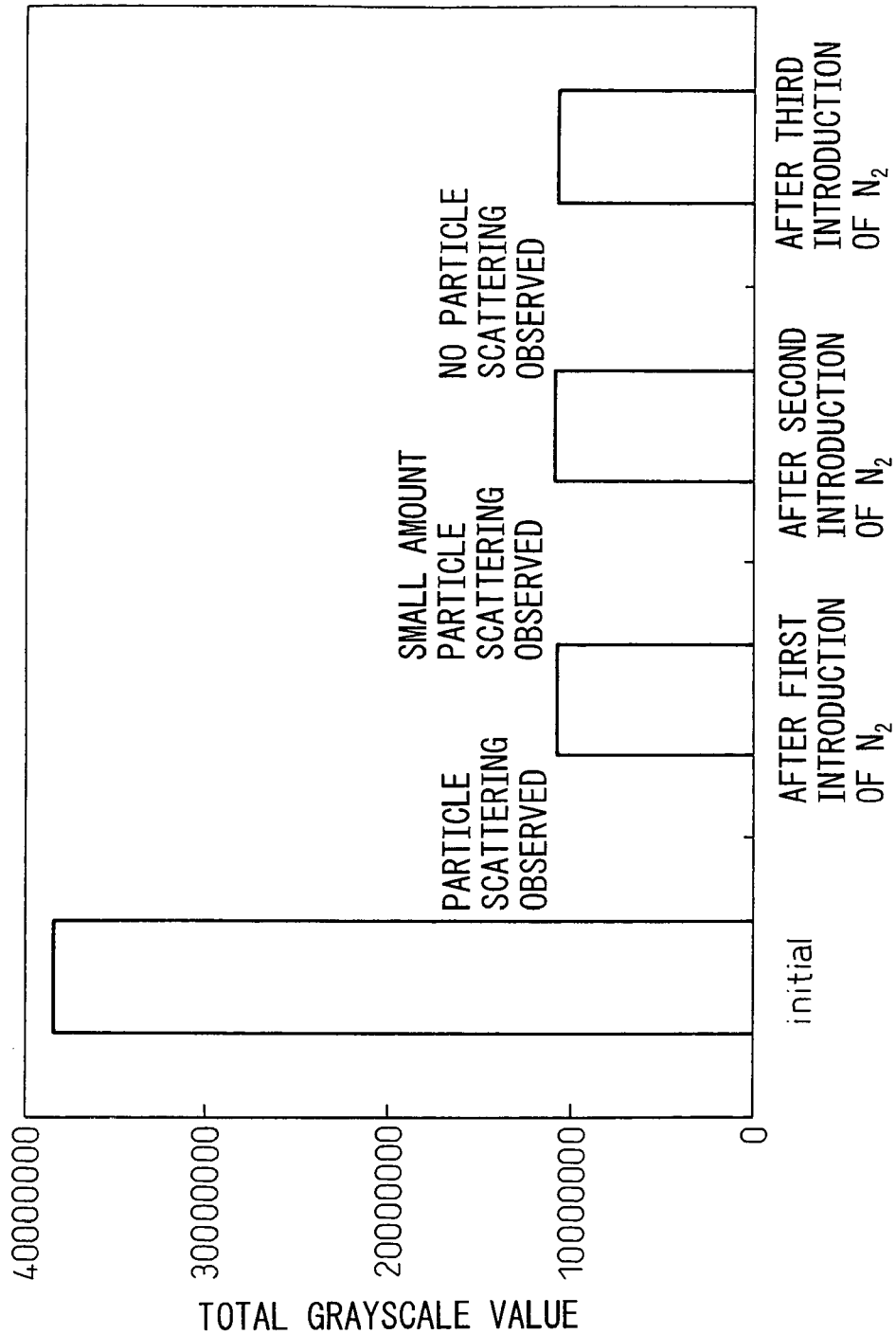
FIG. 9 is a diagram showing the number of particles scattering caused by a gas shock wave applied repetitively in accordance with the sixth embodiment of the present invention.

FIG. 9 shows the results of an experiment conducted to verify the particle scattering effect of the $N_2$ gas; here, after making $SiO_2$ particles stick to the bare silicon, as in the above example, the $N_2$ gas was introduced at $1.3 \times 10^{-2}$ Pa ($1 \times 10^{-4}$ Torr). In this example, the amount of particle scattering was evaluated by capturing the light scattered by the particles and calculating the luminance value. The vertical axis represents total grayscale value, i.e., scattering intensity. According to the experiment, 60 to 70% of the particles were scattered at the first introduction of the gas, and a small amount of particle scattering occurred at the second introduction; however, at the third introduction of the gas, hardly any scattering occurred. This means that the gas should be introduced twice to accomplish the particle scattering and removal process.

Any suitable gas such as nitrogen, oxygen, argon, etc. can be used as the gas to be introduced here. The shape and position of the hole through which the gas is introduced should be determined so that the shock wave can reach the particles. When introducing the gas through the shower head, the most effective result can be obtained if the shower head is formed with a large number of closely spaced small holes so that the shock wave from the shower head hits the entire stage, but even when the existing shower head is used, a marked effect can be obtained, since 60 to 70% of the particles can be scattered as described above.

Embodiment 7

This embodiment utilizes the thermal stress or the thermophoretic force; that is, by making the temperature of the stage sufficiently higher or lower than its normal operating temperature by using a stage temperature control means, separation of particles due to thermal stress can be induced. Further, by maintaining the stage at a high temperature while holding a predetermined pressure, the particles can be moved away from the stage by the resulting thermophoretic force.

Here, thermophoresis refers to the phenomenon in which a body in a gas having a temperature gradient experiences a greater momentum from molecules on the higher temperature side than from molecules on the lower temperature side, and moves toward the lower temperature side by being subjected to a force acting in the direction opposite to the temperature gradient; the thermophoretic force is dependent on the internal pressure of the chamber and on the temperature gradient in the vicinity of particle surface.

Figure 10:
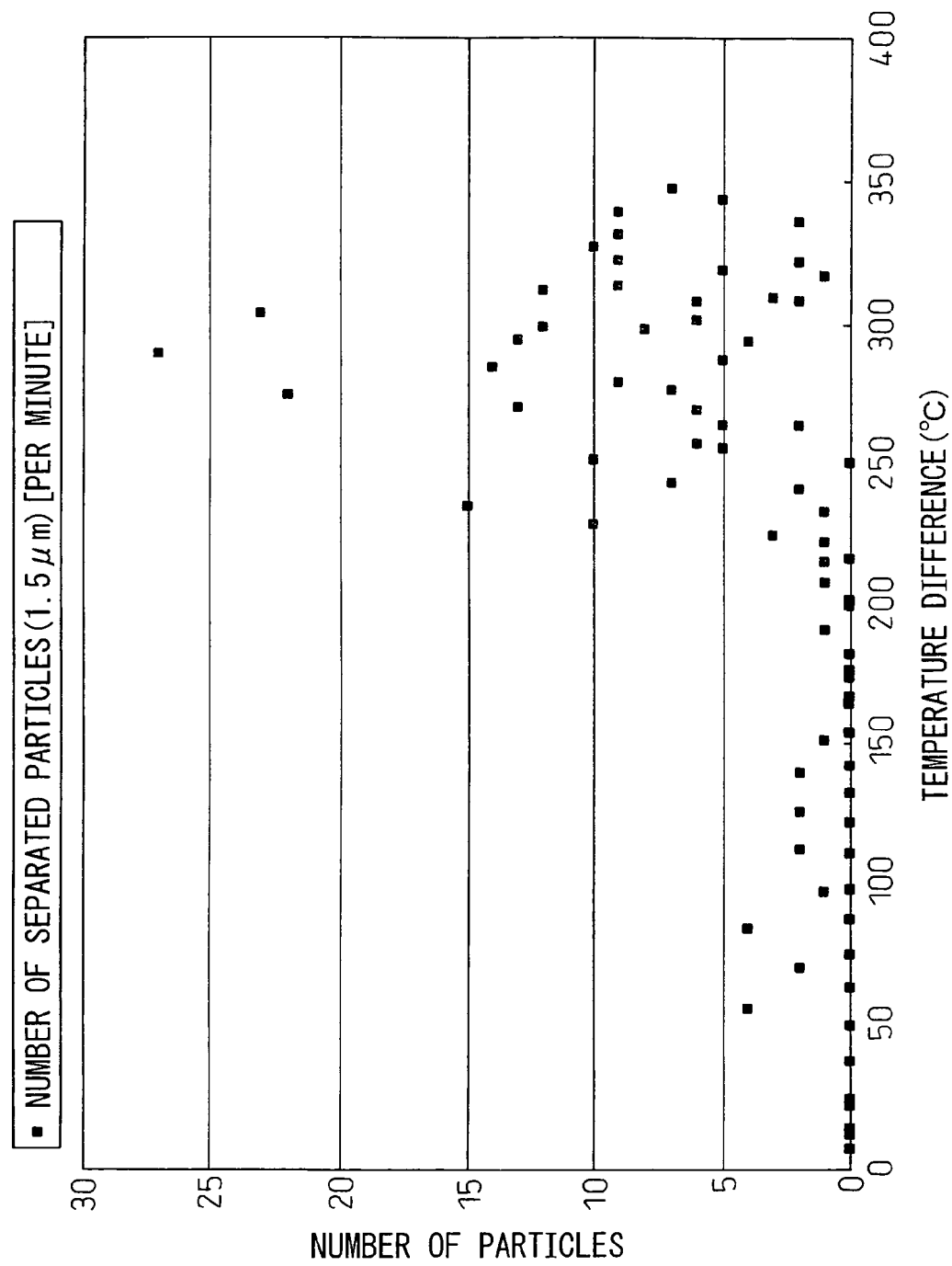
FIG. 10 is a diagram showing the number of particles scattering caused by heating in accordance with a seventh embodiment of the present invention.

FIG. 10 is a graph showing the results of an experiment in which the particles were caused to scatter by heating the stage. In this experiment, Si with $SiO_2$ particles sticking thereto was used as the stage. The pressure was $1.3 \times 10^2$ Pa (1 Torr), and a nitrogen gas was introduced through the upper shower head in order to maintain the shower head disposed above the stage at low temperature. The horizontal axis represent the temperature difference, and the vertical axis represents the number of particles counted for one minute. As can be seen from the figure, the scattering of particles began when the temperature difference increased to about 50° C., and a considerable number of particles were scattered when the difference exceeded 250° C.

According to another experiment in which the stage was heated while varying the pressure, hardly any scattering was observed at 1.3 Pa (0.01 Torr), which shows that the scattering of particles is strongly influenced by the thermophoretic force. According to still another experiment conducted, the scattering particles presumably have initial velocity, and it can be said that the particles are separated from the stage by the resultant of the thermal stress and the thermophoretic force, and are caused to scatter by the thermophoretic force. In this embodiment, the temperature gradient was increased by introducing the nitrogen gas into the shower head which also functions as the upper electrode, but it will be appreciated that other suitable means may be used to increase the temperature gradient.

Embodiment 8

The scattering of particles can be promoted by applying ultrasonic vibrations to the surface of the stage. That is, the sticking of particles to the substrate can be loosened by applying ultrasonic vibrations. Accordingly, when used in combination with any one of the first to seventh embodiments, the application of ultrasonic vibrations can serve to scatter the particles more effectively. Any suitable method can be employed to apply ultrasonic vibrations, a typical example being a method that connects a piezoelectric element to a portion contacting the stage via a rigid part and applies a voltage to the piezoelectric element.

Figure 12:
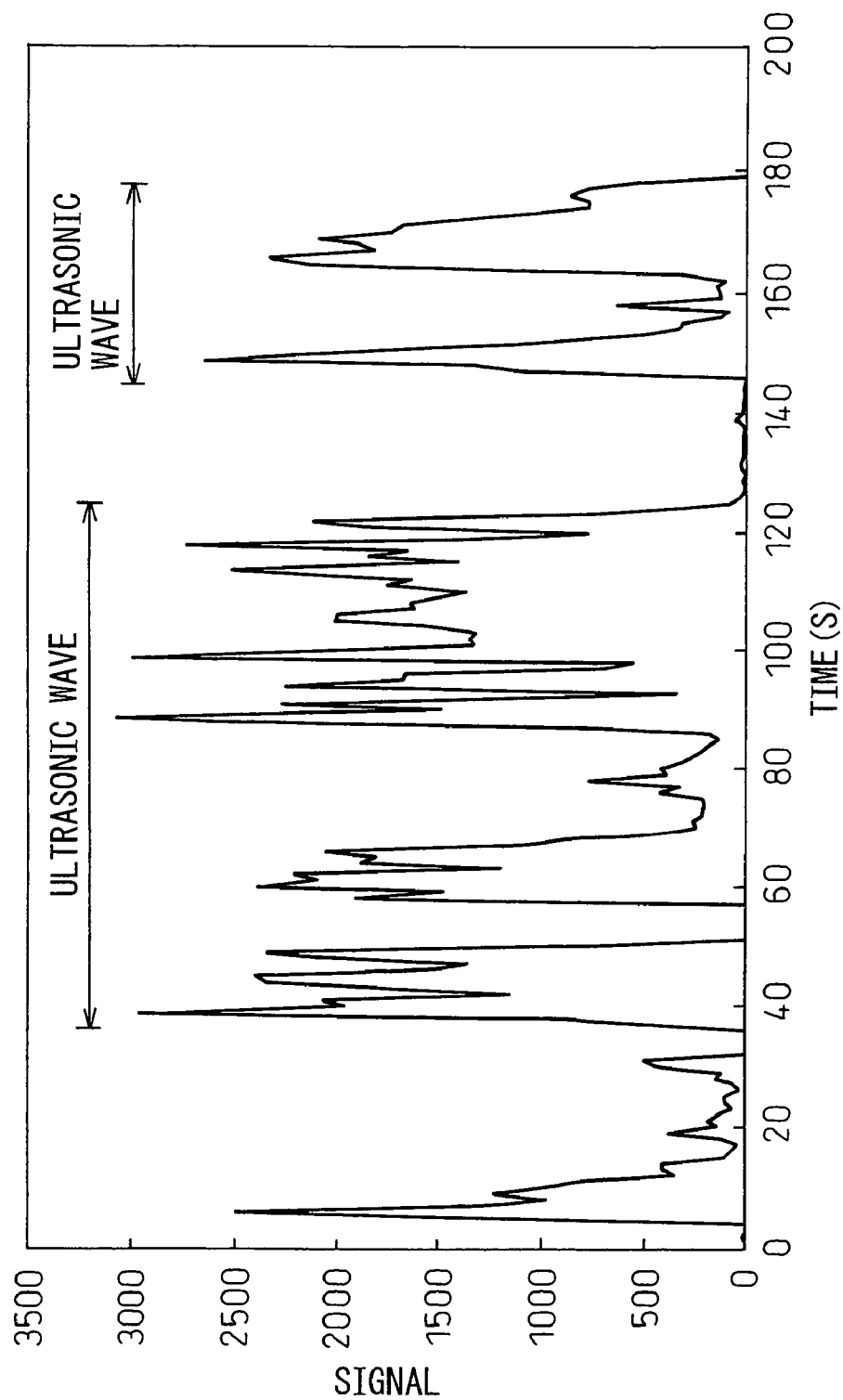
FIG. 12 is a diagram showing the effect of ultrasonic vibrations in accordance with an eighth embodiment of the present invention.

Further, by only applying mechanical vibrations such as ultrasonic vibrations, the scattering or separation of particles occurs. FIG. 12 shows an experimental example showing the particle scattering effect achieved by the application of ultrasonic vibrations. A scanning particle detector was used to detect the scattered particles. In the figure, the horizontal axis represents the time, and the vertical axis represents signals counted by the detector. As shown in the figure, residual particles carried in an evacuation line are detected when the detection is started, but the number of particles detected gradually decreases as the time elapses. However, when vibrations generated by a ultrasonic wave are applied in the periods shown (the period from about 30-second to 130-second points and the period from about 150-second to 180-second points), larger numbers of particles than the particles detected when the detection was started are caused to separate or scatter. It is shown that during the time period that the ultrasonic vibrations are applied, scattered particles are detected intermittently without any appreciable drop in the number detected. Since very few particles are detected during the time that the ultrasonic vibrations are not applied, it can be seen that application of the ultrasonic vibrations is quite effective.

Further, not only by applying ultrasonic vibrations, but also by applying mechanical vibrations caused by the movement of a component member, the sticking particles can be caused to scatter or separate. In particular, the stage is often constructed so as to be movable up and down in the chamber, and it has been found that during the movement of the stage or when the moving stage comes to a stop, mechanical vibrations occur, producing a great effect in causing the particles to scatter or separate. This will be described in detail later.

Embodiment 9

Further, by combining the methods so far described, the particle removal effect can be multiplied. All possible methods may be combined, or several selected methods may be combined. The methods may be combined in any suitable way; for example, the methods that can be carried out simultaneously may be carried out simultaneously or sequentially. The methods that cannot be carried out simultaneously should be carried out sequentially. Further, the methods of the respective embodiments may be carried out repeatedly, or a combination of the methods of some embodiments may be carried out repeatedly; in either case, a highly effective result can be obtained.

For example, first a gas is introduced and the force generated by a shock wave is applied to the particles (sixth embodiment), and thereafter a high voltage is applied (second and third embodiments), while continuing to heat the stage (seventh embodiment); these processes may be carried out repeatedly. Alternatively, these processes may be carried out simultaneously and repeatedly. In particular, when utilizing the gas shock wave, the process should be repeated twice, as previously described.

Embodiment 10

The first to ninth embodiments have each been described as providing a stage cleaning method, but a similar effect can also be obtained if the cleaning method is applied for cleaning other components, for example, the focus ring, included in the stage. Further, a similar effect can be obtained if the method is applied for cleaning other elements in the vacuum chamber that need cleaning.

Embodiment 11

Figure 11:
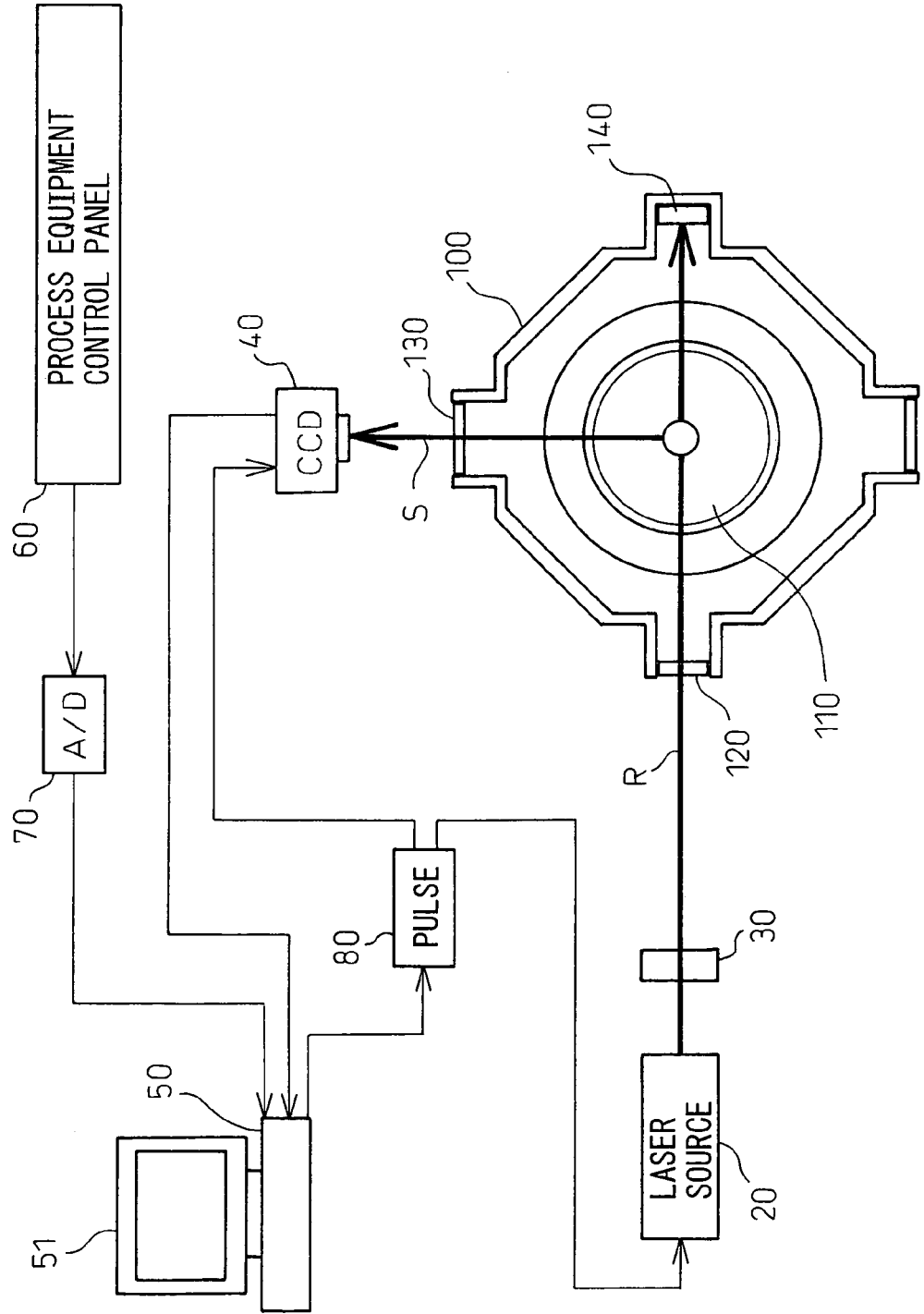
FIG. 11 is a schematic diagram showing a scattering particle detecting apparatus in accordance with an 11th embodiment of the present invention.

In carrying out the method of the present invention, the cleanness of the stage can be evaluated by detecting scattered particles using a particle detecting apparatus such as shown in FIG. 11. Further, the end point of the cleaning can be detected by detecting that the number of particles has dropped below a predetermined number.

FIG. 11 shows the scattered particle detecting apparatus which observes scattered laser light. A stage 110 for mounting a substrate thereon is installed in a vacuum chamber 100. Laser light R from a laser light source 20 is passed through an optical system 30 such as a lens and enters the process chamber through an entrance window 120. The laser light R passing through the optical system 30 is shaped so as to form a flat plate-like beam in a space above the stage 110. The laser light R propagates in the space above the stage 110, while scattered light S, reflected by the particles scattered by the method of the present invention, enters a CCD camera 40 through an exit window 130. The laser light R propagated straight in the space above the stage 110 enters a beam damper 140 where the light is absorbed. The scattered light S that entered the CCD camera 40 is converted into an electrical signal which is supplied to an information processing apparatus 50 such as a personal computer, and an image of scattering particles is displayed on a display part 51. In the present embodiment, the image is captured as a moving image which varies with time, but the image may be captured as a still image. Control information from a process equipment control panel 60 is supplied via an A/D converter 70 to the information processing apparatus 50 which, based on the supplied information, controls the laser light source 20 and the CCD camera 40 via a pulse generator 80.

The laser light R emitted for entrance into the chamber 100 is controlled so that the light enters at a position aligned so as to be able to detect the scattered particles accurately. For instance, to detect the scattered particles near the stage, the laser light should be made to enter at a height of 3 mm to 4 mm above the stage, and to detect the particles scattering higher than that, the laser light should be shaped to be high enough to cover the higher portion.

The light source is not limited to the laser light source, but a lamp may be used as the light source. For the light detector, any suitable device, such as a photomultiplier, can be used.

The CCD camera as the detector is arranged so as to capture the scattering light S scattering in a direction perpendicular to the incident light R, but may be arranged at some other angle, or alternatively, a plurality of detectors may be arranged at suitable angles.

FIGS. 4, 7, and 8 show examples of captured images; as can be seen, the scattered particles are clearly captured.

Embodiment 12

While studying the cleaning process for separating particles from the wall surfaces of the chamber and removing the separated particles by carrying them in a gas flow, it has been found that, to effectively carry the particles in the gas flow, the internal pressure of the chamber must be maintained not lower than a certain value ($1.3 \times 10^3$ Pa (10 Torr)). In the step of separating the particles, any means according to the present invention may be used, but in the case of a vacuum chamber, such as a process chamber, that has a mechanism for electrostatically holding a wafer, the means for separating the particles by utilizing Maxwell's stress occurring due to the application of a high voltage can be employed. Examples of the vacuum chamber include, in addition to the process chamber, vacuum transfer chambers such as a load lock chamber, transfer chamber, cassette chamber, etc.

Figure 13:
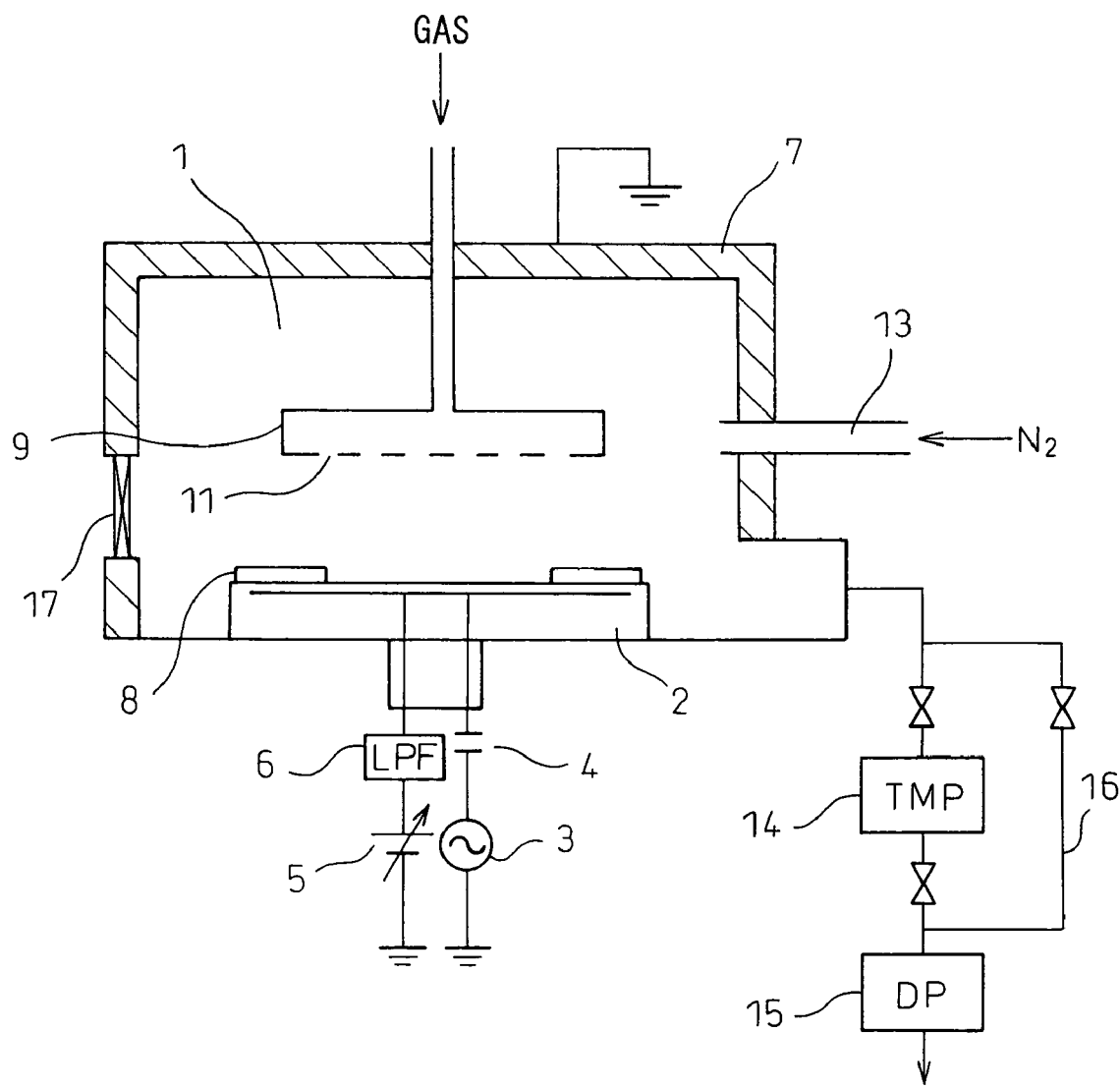
FIG. 13 is a schematic diagram showing a plasma processing apparatus in accordance with a 12th embodiment of the present invention.

FIG. 13 shows one example of an apparatus for implementing the cleaning process of the present embodiment. The diagram of FIG. 13 corresponds to the diagram of the plasma etching apparatus shown in FIG. 1, except that a vent line, an evacuation system, and a wafer loading gate, omitted in FIG. 1, are added; therefore, the same parts as those in FIG. 1 are designated by the same reference numerals. The vent line 13 in the present embodiment is a passage for passing therethrough a purge gas such as a nitrogen gas, and comprises a pipe and a valve but does not have an orifice structure such as that of a flow rate control device. The vent line 13 can also be used as a passage for introducing a reactive gas; in that case, the purge gas is introduced through the shower head 9. In this case also, no orifice structure is provided in the passage constructed as the vent line. The reason is that, if an orifice structure is provided, the gas flow may be impeded leading to an inability to generate a shock wave. The evacuation system comprises a turbo molecular pump (TMP) 14 as the main pump, behind which is provided a dry pump (DP) 15 as a roughing vacuum pump. Further, the wafer load/unload gate 17 is provided in the present embodiment.

Figure 14:
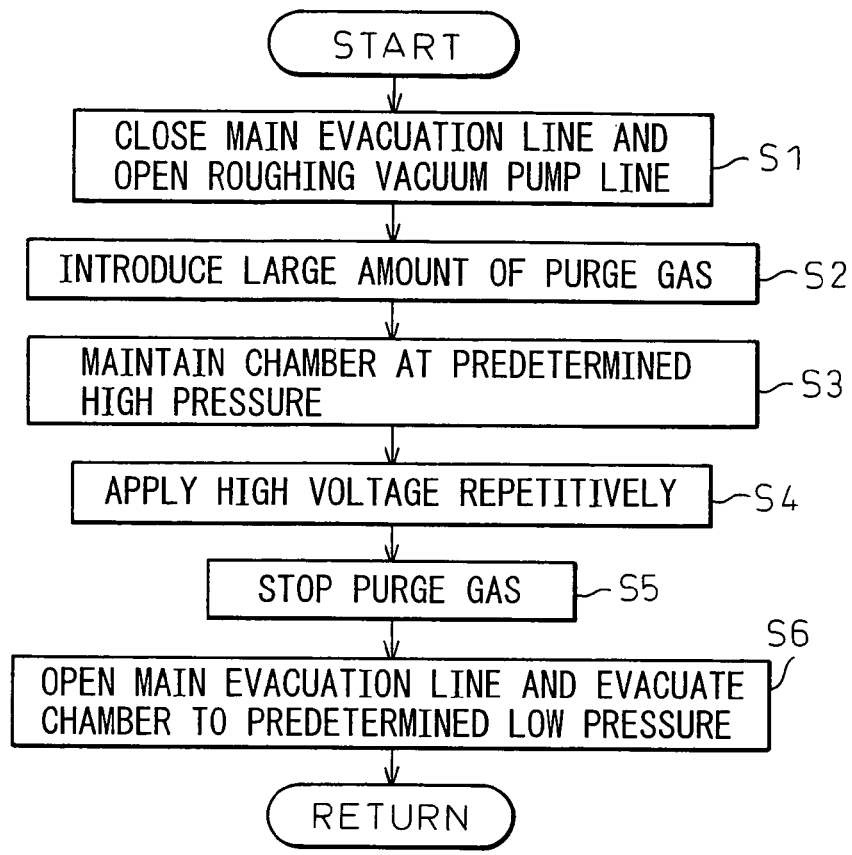
FIG. 14 is a diagram showing a flow of a cleaning method in accordance with the 12th embodiment of the present invention.

FIG. 14 shows the cleaning process sequence according to the present embodiment. When the process is started, first in step S1 an automatic pressure control valve (APC) (not shown) is closed, thus closing the main evacuation line of the turbo pump 14 while opening the roughing vacuum pump line 16 of the dry pump (DP) 16.

Next, in step S2, a nitrogen gas is introduced through the vent line 13 at a flow rate as high as, for example, 70,000 cc per minute. The introduction of the large amount of nitrogen gas through the vent line 13 causes a rapid increase in pressure, thus causing the particles in the chamber 1 to separate. The separated particles are carried away through the roughing vacuum pump line 16.

In step S3, the internal pressure of the chamber stabilizes at a certain value depending on the performance of the roughing vacuum pump 15 and the flow rate of the nitrogen gas. In this condition, in step S4 a positive or negative high voltage is repetitively applied to the stage from the electrostatic power supply unit 5. For example, +3 kV and 0 V are repetitively applied. Here, the particles sticking to the inside walls of the chamber are separated from them in accordance with Maxwell's stress, as previously described. The separated particles are carried away together with the nitrogen gas. After the DC high voltage has been applied a predetermined number of times, the introduction of the nitrogen gas is stopped in step S5. As the roughing vacuum pump line is left open, the roughing vacuuming continues.

In step S6, the valve in the roughing vacuum pump line is closed, and the APC is opened to evacuate the chamber through the main vacuum line to a predetermined pressure, for example, $1.3\times10^{-2}$ Pa (0.1 mTorr), by means of the turbo pump 15. The entire flow is repeated as needed.

To verify the effectiveness of this cleaning method, the number of particles passed through the evacuation line (roughing vacuum pump line) was detected by the laser light scattering method described in the 11th embodiment, while varying the internal pressure of the chamber. The results are shown in FIG. 15.

Figure 15:
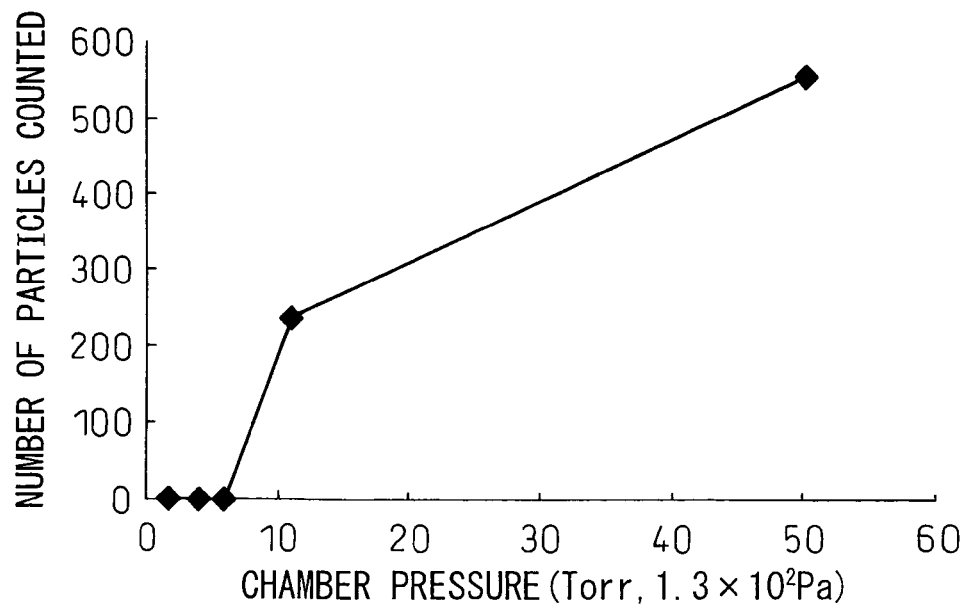
FIG. 15 is a diagram showing the relationship between the internal pressure of a chamber and the number of particles according to the cleaning method of the 12th embodiment of the present invention.

In FIG. 15, the internal pressure of the chamber is plotted along the horizontal axis, and the number of particles counted is plotted along the vertical axis. As can be seen, when the internal pressure of the chamber is lower than about 1333.22 Pa (10 Torr), no particles are detected in the evacuation line. When the pressure exceeds about 1333.2 Pa, particles begin to be detected, and thereafter, the number of particles removed increases as the internal pressure of the chamber rises.

It has been discovered that the reason that there are no particles passing through the evacuation line at pressures lower than about 1333.22 Pa (10 Torr) is because the gas viscous force imparted to the particles is small when the pressure is low. Accordingly, when carrying away the particles, the effectiveness increases as the internal pressure of the chamber is raised, and it is preferable to set the chamber pressure, for example, at $6.7\times10^3$ Pa (50 Torr) or higher.

The means employed in step S4 to separate the particles was the high voltage application which utilizes Maxwell's stress, but instead, any of the previously described particle separation method may be used here. That is, use may be made of the Coulomb force or of the shock wave generated by a rapid introduction of a gas, or the thermal stress or thermophoretic force may be used by controlling the temperature of the stage, and in addition, mechanical vibrations may be applied.

Embodiment 13

In the 12th embodiment described above, as priority is given to carrying away the particles by utilizing the gas flow, the application of the high voltage for separating the particles is performed in a relatively high pressure atmosphere. However, it is known that if the particles are to be separated or scattered by making effective use of Maxwell's stress occurring due to the high voltage application, the efficiency increases when the high voltage application is performed in a low pressure atmosphere. Further, as described in the sixth embodiment, the scattering of particles utilizing the gas shock wave can also be performed more efficiently at lower pressures.

In view of this, in the present embodiment, provisions are made to perform the cleaning process of the 12th embodiment after performing the introduction of the purge gas and the application of the high voltage at a low pressure as preprocessing steps. That is, in the preprocessing steps, the particles are separated from the inside walls of the chamber in a low pressure atmosphere, and after that, the pressure is increased and the separated particles are carried away. This enhances the particle separation effect as well as the removal effect of the separated particles.

Figure 16:
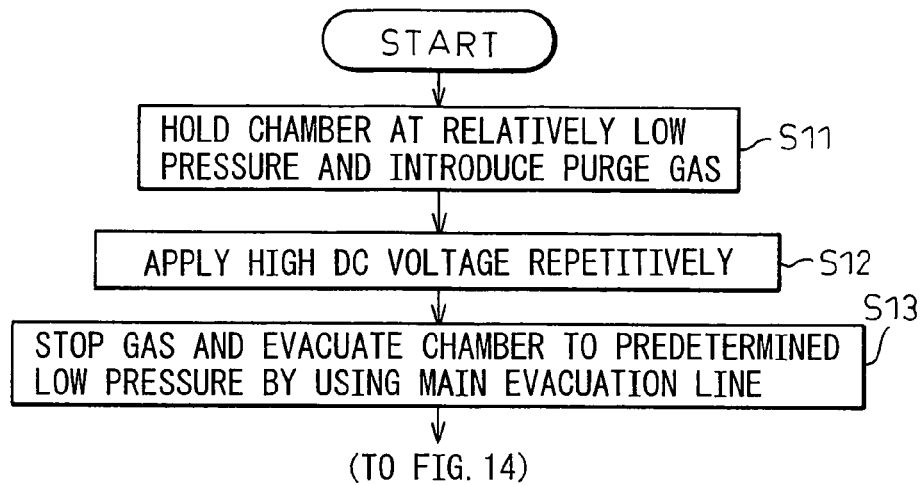
FIG. 16 is a diagram showing a flow of a cleaning method in accordance with a 13th embodiment of the present invention.

FIG. 16 shows a flow illustrating the preprocessing steps of the present embodiment. When the preprocessing is started, first, in step S11, the internal pressure of the chamber is controlled to the pressure used in the actual process (for example, 0.2 Pa (150 mTorr) and nitrogen gas is introduced. Here, the main evacuation line is used, and the chamber is evacuated by the turbo pump 14 and maintained at the predetermined pressure. In this case, the separation of particles by an impact force also occurs more effectively.

Next, in step S12, the high voltage application, which utilizes Maxwell's stress, is performed in order to separate the particles sticking to the inside walls of the chamber. The method of the high voltage application is the same as that employed in step S4 in FIG. 13. However, in step S4 in FIG. 13, the pressure was $6.7\times10^3$ Pa (50 Torr), but the pressure in this preprocessing step is 2.0 Pa (0.15 Torr).

In step S13, the introduction of the nitrogen gas is stopped, and the chamber is evacuated to about $1.3\times10^{-2}$ Pa (0.1 mTorr) by the turbo pump. Then, the process is repeated again, as needed. When the preprocessing is completed after being repeated a predetermined number of times, the process proceeds to the flow of FIG. 14 (12th embodiment). When the main process of the 12th embodiment is performed after performing the preprocessing, a larger number of particles can be separated or scattered and thus removed than would be the case if the preprocessing were not performed.

The high voltage application which utilizes Maxwell's stress has been described as being the means used in the preprocessing step to separate the particles, but instead, use may be made of the Coulomb force or of the shock wave generated by a rapid introduction of a gas, or the thermal stress or thermophoretic force may be used by controlling the temperature of the stage and, in addition, mechanical vibrations may be applied.

Figure 17:
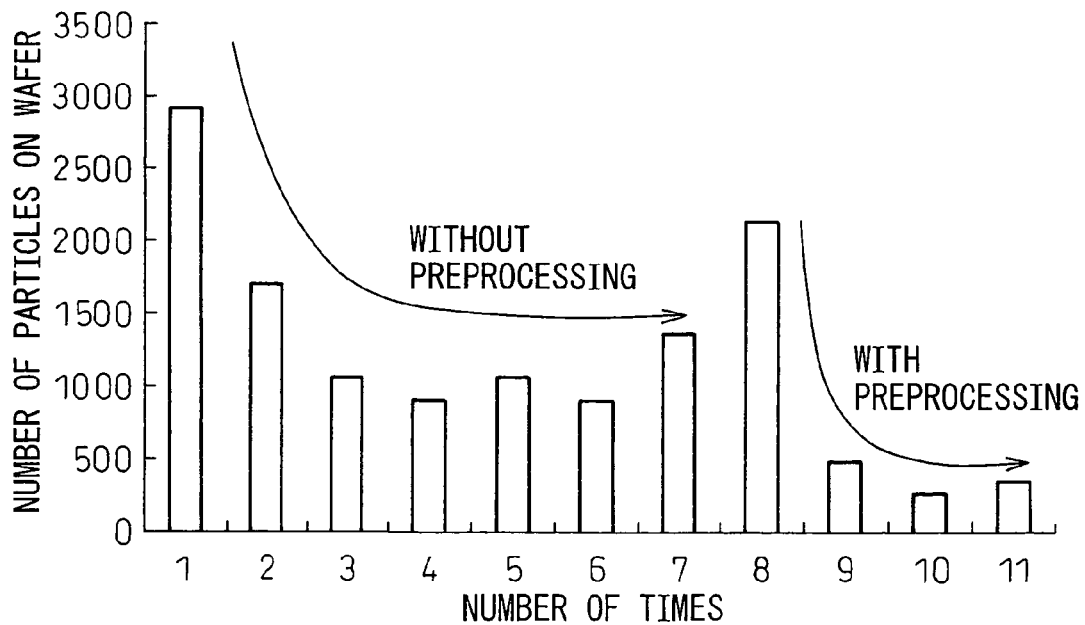
FIG. 17 is a diagram showing the effect of preprocessing in accordance with the 13th embodiment of the present invention.

FIG. 17 is a graph showing how the number of particles varies when the preprocessing is performed in comparison with the case where the preprocessing is not performed. In the figure, the horizontal axis represents the number of times that actual etching was carried out, and the vertical axis represents the number of particles remaining on the wafer. The number of times "1" corresponds to the initial condition of the chamber, showing that nearly 3,000 particles were initially present. Thereafter, up to the number of times "7", actual etching was carried out while performing the particle removal process without preprocessing; then, between the number of times "7" and "8", the particle removal was not performed, and from the number of times "8" to "11", the particle removal process with preprocessing was performed.

As shown in FIG. 17, as the particle removal process without preprocessing was repeated, the number of particles decreased down to about 1000, but thereafter, the number of particles did not decrease further even when the process was further repeated. After that, according to a series of experiments conducted in the same chamber, the particle removal process was not performed between the number of times "7" and "8" and, after the condition returned to the initial condition shown at the number of times "8", the particle removal process with preprocessing was performed, as a result of which the number of particles could be reduced to 500 or less. In the example of FIG. 17, as the experiment was started in the condition in which a large number of particles were present, many particles remained unremoved even after the particle removal process with preprocessing was performed.

Figure 18:
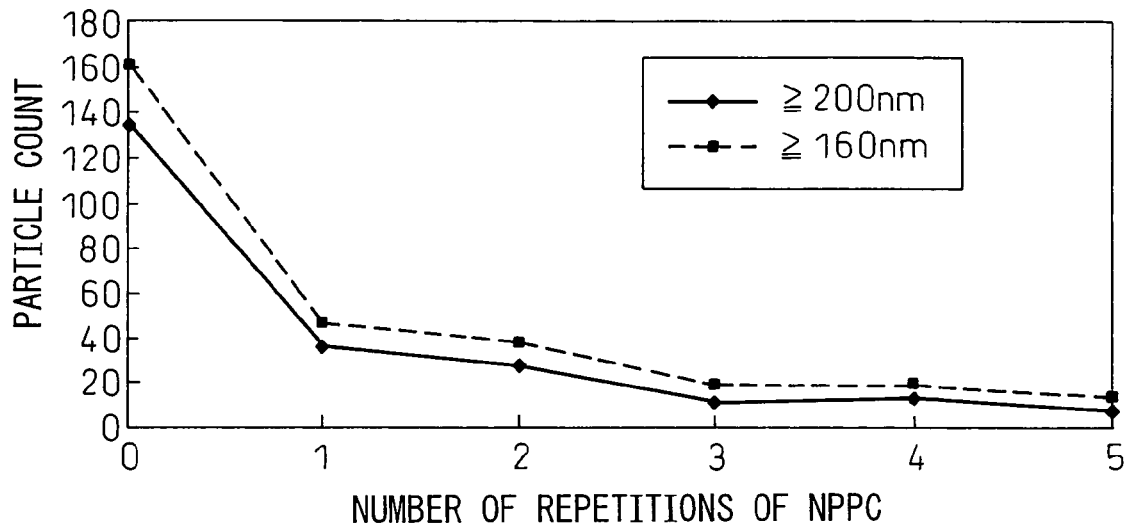
FIG. 18 is a diagram showing the relationship between the number of particles remaining on a wafer and the number of repetitions of particle removal when the particle removal with preprocessing was performed in accordance with the 13th embodiment of the present invention.

FIG. 18 shows correlation between the number of particles remaining on the wafer and the number of repetitions of the particle removal process with preprocessing when the mass production process was performed using conventional mass production equipment by performing the particle removal process with preprocessing according to the present invention. The horizontal axis represents the number of repetitions of the particle removal (NPPC: Non-Plasma Particle Cleaning) process with preprocessing, and the vertical axis represents the number of particles counted. Immediately after the apparatus was started up, nearly 140 particles of diameter 200 nm or larger ($\geqq 200$ nm $\phi$) were present, but when the process was performed and the particle cleaning process with preprocessing was repeated three times, the number of particles decreased to about 10, achieving a condition generally known as "particle spec", i.e., less than 20. In this way, when there is contamination due to particles, for example, immediately after the startup of the apparatus, the contamination due to particles can be greatly reduced by performing the process of the present embodiment in place of the traditionally employed dummy run or seasoning or pump and purge.

Embodiment 14

As described in the eighth embodiment, the scattering of particles can be induced by applying mechanical vibrations. The present inventor et al. have found that the scattering of particles, caused presumably by mechanical vibrations, also occurs during the movement of the wafer stage or when the stage comes to a stop. Not only the scattering of particles off the wafer stage, but also the separation of particles off the inside walls, including the upper electrode disposed opposite the wafer stage, was observed. Vibrations due to the movement of the wafer stage can also be transmitted via a gas remaining in the chamber. In the present embodiment, the separation effect is enhanced by introducing a wafer stage driving sequence in the particle removal process described in the 12th embodiment. The flow of the present embodiment is the same as the flow of the 13th embodiment (FIG. 13), except that step S35 is added between step S3 and step S4.

Figure 19:
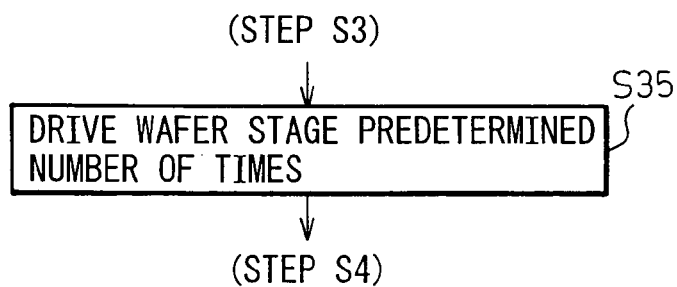
FIG. 19 is a diagram showing one step in a cleaning method in accordance with a 14th embodiment of the present invention.

FIG. 19 shows step S35. After the pressure is maintained at about $6.7 \times 10^3$ Pa (50 Torr) by introducing the nitrogen gas in step S3 (FIG. 13), the wafer stage is driven repeatedly in step S35 and is thus moved up and down a plurality of times, before proceeding to the high voltage application in step S4. The vibrations generated cause the particles sticking to the inside walls of the chamber to separate from them, or make the particles easier to separate, facilitating their separation in the subsequent high voltage application step.

When the particles were observed by the laser light scattering method (11th embodiment) while moving the wafer stage, scattering particles were observed the instant that the wafer stage stopped moving upward. This is because the sticking of the particles is temporarily loosened by the mechanical vibrations occurring the instant that the wafer stage comes to a stop, and the particles sticking to the wafer stage scatter upward by inertia, while the particles sticking to the upper electrode drop by gravity. The particle separation effect at this time is greater than that achieved by the high voltage application, and the separated particles are effectively carried by passing a gas such as a nitrogen gas at a pressure of $1.3 \times 10^3$ Pa (10 Torr) or higher.

Figure 20:
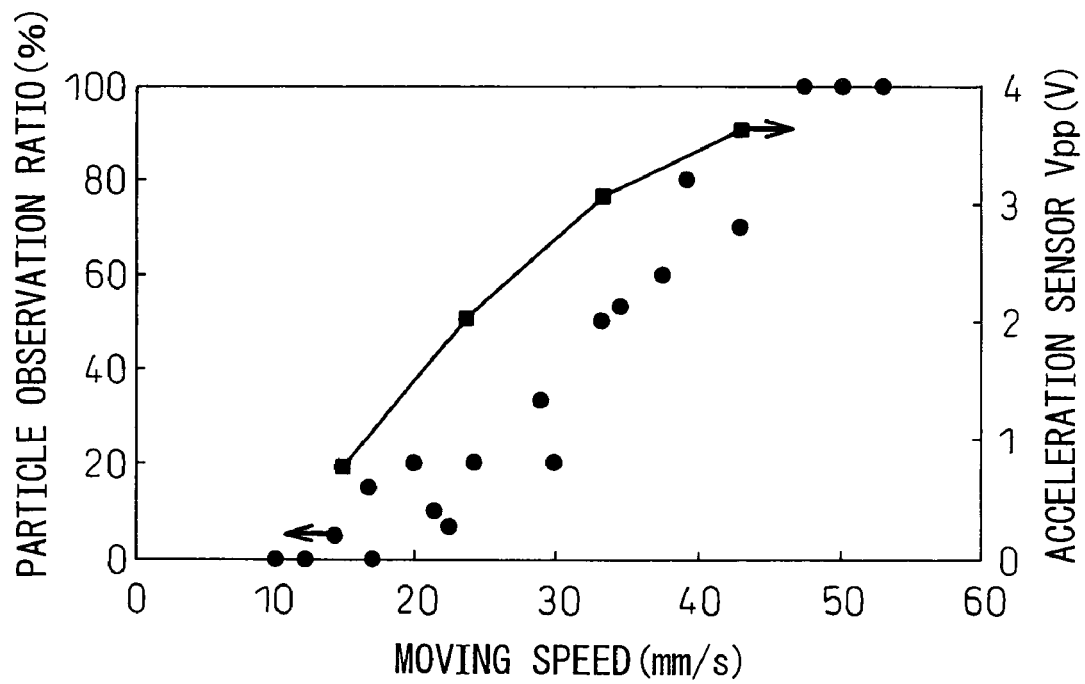
FIG. 20 is a diagram showing the relationship between moving speed and particles in accordance with the 14th embodiment of the present invention.

FIG. 20 shows the relationship between the number of particles and the moving speed of the wafer stage when the wafer stage is moved upward. In FIG. 20, the horizontal axis represents the moving speed of the wafer stage, and the vertical axis at left represents the particle observation ratio, while the vertical axis at right represents the acceleration sensor value. The particle observation ratio is the ratio of the number of times particles were observed to the number of times the stage was driven, and is proportional to the number of particles separated. The acceleration sensor value indicates the vibration caused by the stopping of the wafer stage. As can be seen from the figure, to achieve the effect of the present embodiment, a higher moving speed is more desirable. This is because the kinetic energy of the wafer stage works as the energy that causes the particles to separate and, as the kinetic energy is proportional to the mass of a moving body and to the square of its velocity, a greater effect can be obtained when the wafer stage of large mass is moved at high speed and is caused to stop. As the acceleration sensor value in FIG. 20 shows, the higher the moving speed is at the time just before the stopping, the greater is the vibration.

While the present embodiment has utilized the vibrations occurring during the driving of the wafer stage, it will be recognized that not only the vibrations caused by the movement of the wafer stage but, if there is any other moving member in the chamber, the vibrations caused by the movement of such a member can also be utilized. For example, use can also be made of the vibrations occurring when driving a rotating mechanism for a magnet provided to adjust the magnetic field to be applied to the plasma, an up-down moving mechanism for a pin provided on the wafer stage for transferring a wafer, or an open/close mechanism for a shutter provided in the wafer load/unload gate. If there is no such driving member that generates vibrations in the chamber, a vibration generating unit, for example, a unit having such a structure as an impact driver, may be installed to generate the necessary vibrations.

The method of utilizing the mechanical vibrations of the driving members can be applied not only to the 14th embodiment described here, but also to the preprocessing in the 13th embodiment. Further, as the application of mechanical vibrations facilitates the scattering or separation of particles, the method may be used in combination with any particle scattering or separating means described in the present invention.

What is claimed is:

1. An element cleaning method for scattering particles sticking to an element in a process chamber and removing the particles by using a gas flow, comprising the steps of:
   evacuating the process chamber to reduce a pressure in the process chamber to a first pressure;
   scattering the particles sticking to the element; and
   setting the pressure in the process chamber to a second pressure that is higher than the first pressure and removing the scattered particles from the process chamber by using the gas flow,
   wherein the particles are scattered under the first pressure that is not more than $1.3 \times 10^{-2}$ Pa and are effectively removed by using the gas flow under the second pressure not less than $1.3 \times 10^3$ Pa, and the gas flow is caused by evacuating the process chamber while gas is being introduced into the process chamber.

2. The element cleaning method as claimed in claim 1, wherein in the particle scattering step, a voltage is applied to the element.

3. The element cleaning method as claimed in claim 2, wherein the applied voltage is a voltage of the same polarity as a charge of the particles that are charged.

4. An element cleaning method as claimed in claim 2, wherein the applied voltage scatters the particles in accordance with a permittivity difference between the element and the particles sticking to the element.

5. The element cleaning method as claimed in claim 1, wherein in the particle scattering step, a gas shock wave is generated by rapidly introducing large quantities of predetermined high pressure gas into the process chamber, and the generated gas shock wave is propagated to hit the element.

6. The element cleaning method as claimed in claim 5, wherein a shower head arranged to introduce process gas is used to introduce the predetermined high pressure gas and generate the gas shock wave.

7. An element cleaning method as claimed in claim 5, wherein the gas shock wave is generated by a rising rate of pressure of an introduction of the cleaning gas above a predetermined rate.

8. The element cleaning method as claimed in claim 1, wherein in the particle scattering step, the particles sticking to the element are scattered by using a thermal stress and a thermophoretic force induced by controlling the temperature of the element.

9. The element cleaning method as claimed in claim 1, wherein in the particle scattering step, mechanical vibrations are applied to the element.

10. The element cleaning method as claimed in claim 9, wherein the mechanical vibrations are applied by driving a movable element in the process chamber.

11. The element cleaning method as claimed in claim 10, wherein the movable element is a stage for mounting thereon a substrate to be processed in the process chamber.

12. An element cleaning method as claimed in claim 1, wherein in the particle scattering step, any of following (a) to (d) are combined:
    (a) rapidly introducing large quantities of predetermined high pressure gas,
    (b) applying to the element a voltage of the same polarity as the charge of the charged particles,
    (c) using a thermal stress and a thermophoretic force induced by controlling the temperature of the element, and
    (d) applying mechanical vibrations to the element.

* * * * *